US011810916B2

(12) United States Patent
Huang

(10) Patent No.: US 11,810,916 B2
(45) Date of Patent: *Nov. 7, 2023

(54) SEMICONDUCTOR CAPACITOR ARRAY LAYOUT CAPABLE OF GENERATING PARASITIC CAPACITANCE TOWARD EDGE OF LAYOUT

(71) Applicant: REALTEK SEMICONDUCTOR CORPORATION, Hsinchu (TW)

(72) Inventor: Shih-Hsiung Huang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/676,855

(22) Filed: Feb. 22, 2022

(65) Prior Publication Data

US 2022/0367448 A1 Nov. 17, 2022

(30) Foreign Application Priority Data

May 11, 2021 (TW) .................................. 110116897

(51) Int. Cl.
*H01L 27/08* (2006.01)

(52) U.S. Cl.
CPC ................................. *H01L 27/0805* (2013.01)

(58) Field of Classification Search
CPC ............... H01L 27/0805; H01L 27/101; H01L 27/0207; H01L 28/60
(Continued)

(56) References Cited

U.S. PATENT DOCUMENTS

2009/0051040 A1* 2/2009 Chuang ............... H01L 23/5286
716/132
2009/0201625 A1* 8/2009 Liao .................... H01L 23/5223
361/301.4
(Continued)

FOREIGN PATENT DOCUMENTS

CN 111199129 A 5/2020

OTHER PUBLICATIONS

OA letter of a counterpart TW application (appl. No. 110116897) dated Feb. 17, 2022. Summary of the OA letter: (1) Claims 1-10 are rejected as being unpatentable over the cited reference 1 (CN111199129A, also published as US2020/0134130A1). P.S. Correspondence between the claims of the TW counterpart application and the claims of the present US application: (1) Claims 1-10 of the TW counterpart application are corresponding to the claims 1-10 of the present US application respectively.

*Primary Examiner* — Duy T Nguyen
(74) *Attorney, Agent, or Firm* — WPAT, P.C

(57) ABSTRACT

A semiconductor capacitor array layout generates parasitic capacitance toward an edge of the layout so as to reduce a capacitance difference between an outer capacitor unit and an inner capacitor unit. The semiconductor capacitor array layout includes a first conductive structure and a second conductive structure. The first conductive structure includes: longitudinal first conductive strips disposed in a first integrated circuit (IC) layer; and lateral first conductive strips disposed in a second IC layer. The longitudinal and lateral first conductive strips jointly form well-type structures including outer wells and inner wells that are electrically connected. The second conductive structure includes second conductors disposed in the first IC layer. The second conductors include outer conductors and inner conductors that are electrically disconnected and respectively disposed in (Continued)

the outer wells and the inner wells. The outer wells and the closest inner conductors jointly generate parasitic capacitance.

10 Claims, 6 Drawing Sheets

(58) Field of Classification Search
USPC .......................................................... 257/532
See application file for complete search history.

(56) References Cited

U.S. PATENT DOCUMENTS

| | | | | |
|---|---|---|---|---|
| 2011/0113398 | A1* | 5/2011 | Keinert | G06F 30/394 |
| | | | | 716/127 |
| 2014/0049872 | A1* | 2/2014 | Huang | H01L 28/90 |
| | | | | 361/301.4 |
| 2014/0145304 | A1* | 5/2014 | Lin | H01G 4/38 |
| | | | | 257/532 |
| 2018/0358427 | A1* | 12/2018 | Lan | H01L 28/86 |
| 2019/0244894 | A1* | 8/2019 | Fu | H03M 1/804 |
| 2020/0134130 | A1* | 4/2020 | Lei | G06F 30/398 |

* cited by examiner

200

300

SEMICONDUCTOR CAPACITOR ARRAY LAYOUT CAPABLE OF GENERATING PARASITIC CAPACITANCE TOWARD EDGE OF LAYOUT

BACKGROUND OF THE INVENTION

1. Field of the Invention

The present disclosure relates to a semiconductor capacitor array layout, especially to a semiconductor capacitor array layout capable of generating parasitic capacitance toward its edge.

2. Description of Related Art

A general semiconductor integrated circuit (IC) is in the form of a multilayer structure. A conventional semiconductor capacitor array is usually located in a single metal layer of the multilayer structure. The semiconductor capacitor array usually includes multiple rows of capacitor units that are arranged in parallel and include a first row of capacitor units (hereafter referred to as "first capacitor row") and a second row of capacitor units (hereafter referred to as "second capacitor row"). In order to avoid an upper electrode (lower electrode) of the first capacitor row and the trace of a lower electrode (upper electrode) of the second capacitor row jointly generating parasitic capacitance having influence on the accuracy of capacitance of the capacitor units, the gap between the first capacitor row and the second capacitor row needs to be broaden; however, this wastes circuit area. In regard to the above case, the upper electrode (lower electrode) of the first capacitor row is parallel to the trace of the lower electrode (upper electrode) of the second capacitor row and thereby contributes additional capacitance, and this affects the accuracy of capacitance of the capacitor units.

There are other problems with respect to a conventional semiconductor capacitor array. The design of a capacitor unit of some conventional semiconductor capacitor array is shown in FIG. 1a. In FIG. 1a, the upper electrode 110 is in the form of a U-shaped structure including two longitudinal parts and one lateral part, the lower electrode 120 is in the form of a strip-shaped structure. In comparison with a general mature process, in some advanced process (e.g., Fin Field-Effect Transistor (FinFET) process) the ratio (W/L) of the width "W" of the lateral part of the U-shaped structure to the length "L" of the longitudinal part of the U-shaped structure should be larger as shown in FIG. 1b to conform to the specification of the advanced process. Since a semiconductor capacitor array usually includes a large amount of capacitor units, once the ratio (W/L) of the U-shaped structure of every capacitor unit is enlarged, the overall semiconductor capacitor array will consume a lot of additional circuit area. It should be noted that FIGS. 1a-1b shows the variation in the ratio (W/L) of the U-shaped structure rather than the actual size of the U-shaped structure.

FIG. 2 shows a general semiconductor capacitor array layout 200 including effective capacitor units (i.e., the capacitor units labeled with "C" in FIG. 2) and dummy capacitor units (i.e., the capacitor units labeled with "D" in FIG. 2). The dummy capacitor units in the periphery of the layout 200 are short-circuited to prevent the generation of undesired capacitance. An effective capacitor unit in the interior of the layout 200 does not generate parasitic capacitance in conjunction with the neighboring dummy capacitor unit but generate parasitic capacitance (as indicated by the dotted lines in FIG. 2) in conjunction with the neighboring effective capacitor unit. Accordingly, the overall capacitance of each effective capacitor unit between a dummy capacitor unit and an effective capacitor unit will be different from the overall capacitance of each effective capacitor unit between two effective capacitor units. This difference in capacitance is a disadvantage for some application (e.g., a capacitive digital-to-analog converter (CDAC)); for example, the difference in capacitance will cause the degradation of the linearity of a CDAC.

SUMMARY OF THE INVENTION

An object of the present disclosure is to provide a semiconductor capacitor array layout capable of generating parasitic capacitance toward an edge of the semiconductor capacitor array layout and thereby preventing the problems of the prior art.

An embodiment of the semiconductor capacitor array layout of the present disclosure includes a first conductive structure and a second conductive structure. The first conductive structure includes M longitudinal first conductive strips and N lateral first conductive strips, wherein the M is an integer greater than two and the N is an integer greater than one. The M longitudinal first conductive strips are located in a first integrated circuit (IC) layer; and the N lateral first conductive strips are located in a second IC layer. The N lateral first conductive strips are coupled to the M longitudinal first conductive strips through first vias, and the N lateral first conductive strips and the M longitudinal first conductive strips jointly form [(M−1)×(N−1)] well-shaped structures. The [(M−1)×(N−1)] well-shaped structures include (N−1) outer well(s) and {[(M−2)×(N−1)]} inner well(s), and the (N−1) outer well(s) and the {[(M−2)× (N−1)]} inner well(s) are electrically coupled together.

In regard to the above embodiment, the second conductive structure includes [(M−1)×(N−1)] second conductors located in the first IC layer. The [(M−1)×(N−1)] second conductors are respectively positioned in the [(M−1)× (N−1)] well-shaped structures, and include (N−1) outer second conductor(s) and [(M−2)×(N−1)] inner second conductor(s). The (N−1) outer second conductor(s) is/are positioned in the (N−1) outer well(s), and the {[(M−2)×(N−1)]} inner second conductor(s) are positioned in the {[(M−2)× (N−1)]} inner well(s). The (N−1) outer second conductor(s) and the {[(M−2)×(N−1)]} inner second conductor(s) are not electrically coupled together. The M longitudinal first conductive strips and the N lateral first conductive strips are used for the transmission of a first voltage; the {[(M−2)× (N−1)]} inner second conductor(s) is/are used for the transmission of a second voltage; and the (N−1) outer second conductor(s) is/are used for the transmission of a predetermined voltage (e.g., a voltage such as an operating voltage $V_{DD}$ or a ground voltage GND that can be used easily) or not used for any voltage transmission. The first voltage is different from each of the second voltage and the predetermined voltage. The predetermined voltage is different from the second voltage. The {[(M−2)×(N−1)]} inner second conductor(s) include(s) (N−1) inner second conductor(s) closest to the (N−1) outer well(s), and the (N−1) inner second conductor(s) and the (N−1) outer well(s) jointly generate the parasitic capacitance.

Another embodiment of the semiconductor capacitor array layout of the present disclosure includes a primary capacitor structure and an outer capacitor structure. The primary capacitor structure includes a first conductive structure and a second conductive structure. The first conductive structure includes longitudinal first conductive strips and lateral first conductive strips, wherein the longitudinal first conductive strips are located in a first IC layer, and the lateral first conductive strips are located in a second IC layer and coupled to the longitudinal first conductive strips through first vias. The second conductive structure includes longitudinal second conductive strips and lateral second conductive strips, wherein the longitudinal second conductive strips are located in the first IC layer, and the lateral second conductive strips are located in the second IC layer and coupled to the longitudinal second conductive strips through second vias. The longitudinal first conductive strips and the longitudinal second conductive strips are alternatively disposed in the first IC layer, and the lateral first conductive strips and the lateral second conductive strips are alternatively disposed in the second IC layer.

In regard to the above embodiment, the outer capacitor structure includes a third conductive structure and a fourth conductive structure. The third conductive structure includes longitudinal third conductive strips and lateral third conductive strips, wherein the longitudinal third conductive strips are located in the first IC layer, and the lateral third conductive strips are located in the second IC layer and coupled to the longitudinal third conductive strips through third vias. The fourth conductive structure includes longitudinal fourth conductive strips and lateral fourth conductive strips, wherein the longitudinal fourth conductive strips are located in the first IC layer, and the lateral fourth conductive strips are located in the second IC layer. The longitudinal third conductive strips and the longitudinal fourth conductive strips are alternatively disposed in the first IC layer, and the lateral third conductive strips and the lateral fourth conductive strips are alternatively disposed in the second IC layer.

In regard to the above embodiment, the first conductive structure and the third conductive structure are electrically coupled together and used for the transmission of a first voltage. The second conductive structure is used for the transmission of a second voltage. The fourth conductive structure is used for the transmission of a predetermined voltage (e.g., a voltage such as an operating voltage $V_{DD}$ or a ground voltage GND that can be used easily) or not used for any voltage transmission. The first voltage is different from each of the second voltage and the predetermined voltage. The second voltage is different from the predetermined voltage. The second conductive structure and the third conductive structure jointly generate the parasitic capacitance.

These and other objectives of the present invention will no doubt become obvious to those of ordinary skill in the art after reading the following detailed description of the preferred embodiments that are illustrated in the various figures and drawings.

BRIEF DESCRIPTION OF THE DRAWINGS

FIG. 3b shows a modification of the semiconductor capacitor array layout of FIG. 3a.

DETAILED DESCRIPTION OF THE PREFERRED EMBODIMENTS

The semiconductor capacitor array layout of the present disclosure can mitigate the problem of the prior art about the waste of circuit area, prevent the problem caused by the U-shaped structure of the prior art applied in an advanced process, and reduce the difference in capacitance between an outer capacitor unit and an inner capacitor unit.

Figure 3A:
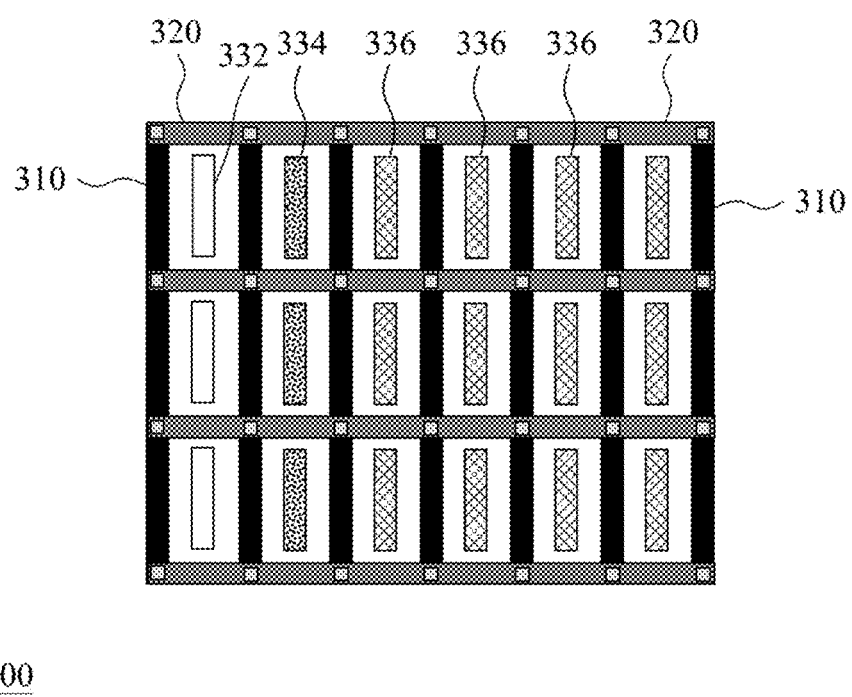
FIG. 3a shows an embodiment of the semiconductor capacitor array layout of the present disclosure.

FIG. 3a shows an embodiment of the semiconductor capacitor array layout of the present disclosure. The semiconductor capacitor array layout 300 of FIG. 3a is included in an integrated circuit (IC) structure (not shown) which includes a substrate and multiple IC layers formed on/above the substrate. The semiconductor capacitor array layout 300 includes a first conductive structure and a second conductive structure. The first conductive structure includes M longitudinal first conductive strips 310 (i.e., the black longitudinal strips in FIG. 3a) and N lateral first conductive strips 320 (i.e., the gray lateral strips in FIG. 3a), wherein the M is an integer greater than two (e.g., M=7 in FIG. 3a) and the N is an integer greater than one (e.g., N=4 in FIG. 3a). The M longitudinal first conductive strips 310 are located in a first integrated circuit (IC) layer, and the N lateral first conductive strips 320 are located in a second IC layer. Both the first IC layer and the second IC layer are metal layers of the aforementioned multiple IC layers and no other metal layer is between the two metal layers, but the implementation of the present invention is not limited thereto. The N lateral first conductive strips 320 are coupled to the M longitudinal first conductive strips 310 through first vias (i.e., the light gray small blocks coupling the lateral first conductive strips 320 with the longitudinal first conductive strips 310). The N lateral first conductive strips 320 and the M longitudinal first conductive strips 310 jointly form [(M−1)×(N−1)] well-shaped structures (e.g., eighteen well-shaped structures in FIG. 3a). The [(M−1)×(N−1)] well-shaped structures include (N−1) outer well(s) (e.g., the left-most three well-shaped structures in FIG. 3a) and {[(M−2)×(N−1)]} inner well(s), and the (N−1) outer well(s) and the {[(M−2)×(N−1)]} inner well(s) are electrically coupled together.

In regard to the embodiment of FIG. 3a, the second conductive structure includes [(M−1)×(N−1)] second conductors (e.g., from the left to the right in FIG. 3a, the white longitudinal strips, the longitudinal strips marked with dots, and the longitudinal strips marked with grids). The shape of each second conductor can be determined according to the demand for implementation; for example, each second conductor can be a single longitudinal/lateral strip, a combination of multiple longitudinal/lateral strips, a combination of at least one longitudinal strip and at least one lateral strip, or a rectangular frame. The [(M−1)×(N−1)] second conductors are located in the first IC layer and respectively positioned in the [(M−1)×(N−1)] well-shaped structures. The [(M−1)×(N−1)] second conductors include (N−1) outer second conductor(s) 332 and {[(M−2)×(N−1)]} inner second conductor(s) 334 and 336. The (N−1) outer second conductor(s) 332 is/are positioned in the aforementioned (N−1) outer well(s), and the {[(M−2)×(N−1)]} inner second conductor(s) are positioned in the aforementioned {[(M−2)×(N−1)]} inner well(s). Each inner second conductor 334/336 is electrically insulated from the inner well around this inner second conductor 334/336 by dielectric (not shown) such as oxide.

In regard to the embodiment of FIG. 3a, the M longitudinal first conductive strips 310 and the N lateral first conductive strips 320 are used for the transmission of a first voltage. The $\{[(M-2)\times(N-1)]\}$ inner second conductor(s) 334 and 336 is/are used for the transmission of a second voltage. The (N−1) outer second conductor(s) is/are used for the transmission of a predetermined voltage (e.g., a voltage such as an operating voltage $V_{DD}$ or a ground voltage GND that can be used easily) or not used for any voltage transmission. Each of the above-mentioned voltages is determined according to the demand for implementation. In the present embodiment, the first voltage is different from each of the second voltage and the predetermined voltage, and the second voltage is different from the predetermined voltage; accordingly, the (N−1) outer second conductor(s) 332 is/are not electrically coupled to the $\{[(M-2)\times(N-1)]\}$ inner second conductor(s) 334 and 336. The $\{[(M-2)\times(N-1)]\}$ inner second conductor(s) 334 and 336 include(s) (N−1) inner second conductor(s) 334 closest to the (N−1) outer well(s), and the (N−1) inner second conductor(s) 334 and the (N−1) outer well(s) jointly generate parasitic capacitance. Accordingly, all the effective capacitor units in the semiconductor capacitor array layout 300 are identical/similar in capacitance.

It should be noted that each inner well and the inner second conductor 334/336 therein jointly function as an effective capacitor unit. Besides, the (N−1) outer well(s) and the (N−1) outer second conductor(s) 332 can jointly function as one or more dummy capacitor units, but the implementation of the present invention is not limited thereto. In addition, the (N−1) outer second conductor(s) can be coupled together through one or more general means such as traces and vias, but the implementation of the present invention is not limited thereto. Moreover, the shape of each outer second conductor 332 can be the same as the shape of each inner second conductor 334/336, but the implementation of the present invention is not limited thereto.

Figure 3B:
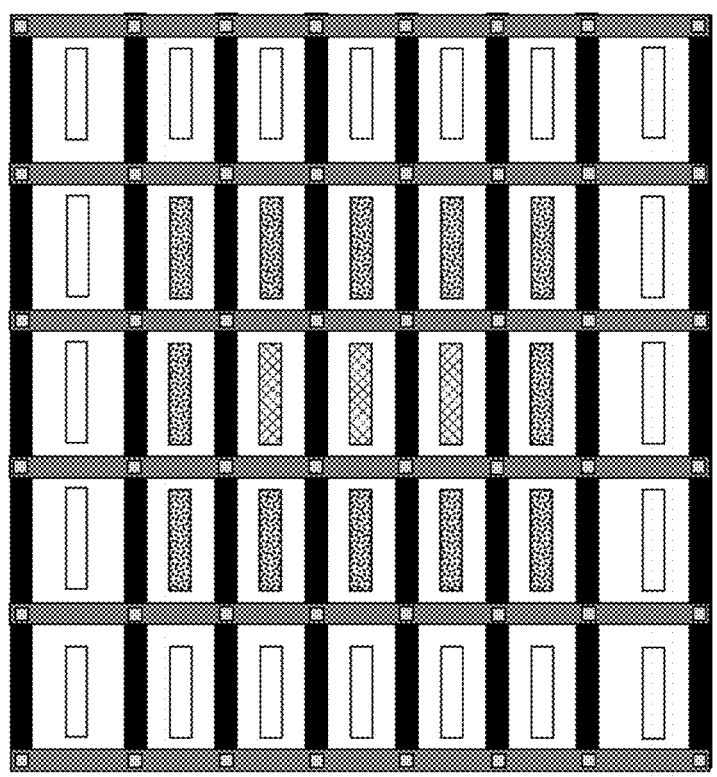

FIG. 3b shows a modification of the embodiment of FIG. 3a. As shown in FIG. 3b, the semiconductor capacitor array layout 300 includes outer wells (i.e., the well-shaped structures in the periphery of the layout 300) and the outer second conductors therein (i.e., the white longitudinal strips in FIG. 3b) to generate parasitic capacitance along with inner second conductors (i.e., the longitudinal strips marked with dots in FIG. 3b) which neighbor on the outer wells. In FIG. 3a, the (N−1) outer well(s) is/are located at the left side of the semiconductor capacitor array layout 300; in FIG. 3b, the outer wells are in the periphery of the semiconductor capacitor array layout 300. It should be noted that the outline of the semiconductor capacitor array layout 300 can be a rectangle or a polygon according to the demand for implementation. Since people having ordinary skill in the art can derive other embodiments from the embodiments of FIGS. 3a-3b, repeated and redundant description is omitted here.

In regard to the embodiment of FIG. 3a, the $\{[(M-2)\times(N-1)]\}$ inner second conductor(s) 334 and 336 include(s) K second conductor(s) 334 (e.g., the longitudinal strips marked with dots in FIG. 3a) pertaining to a first capacitor group of P capacitor group(s), wherein the P is a positive integer and the K is a positive integer (e.g., K=3 in FIG. 3a) not greater than $\{[(M-2)\times(N-1)]\}$. In brief, all the capacitor units pertaining to the same capacitor group can be treated as a larger capacitor. Those having ordinary skill in the art can derive an embodiment having two or more capacitor groups of the P capacitor groups from the present disclosure. For example, the $\{[(M-2)\times(N-1)]\}$ inner second conductor(s) 334 and 336 include(s) L second conductor(s) 336 (e.g., the longitudinal strips marked with grids in FIG. 3a) pertaining to a second capacitor group of the P capacitor groups; in this case, the $\{[(M-2)\times(N-1)]\}$ is an integer (e.g., $[(M-2)\times(N-1)]=15$ in FIG. 3a) greater than one, the P is an integer greater than one, the K is a positive integer (e.g., K=3 in FIG. 3a) not greater than $\{[(M-2)\times(N-1)]\}$, and the L is a positive integer (e.g., L=12 in FIG. 3a) not greater than $\{[(M-2)\times(N-1)]-K\}$.

It should be noted that the semiconductor capacitor array layout 300 can further include a plurality of capacitor-group power supply strips (not shown in the figures) according to the demand for implementation. The capacitor-group power supply strips are located in the second IC layer, the first IC layer, or a third IC layer (e.g., a metal layer) and function as a voltage transmission path for the $\{[(M-2)\times(N-1)]\}$ inner second conductor(s) 334 and 336. For example, the capacitor-group power supply strips include a first capacitor-group power supply strip and a second capacitor-group power supply strip, wherein the first capacitor-group power supply strip is coupled with the aforementioned K second conductor(s) 334 of the first capacitor group, and the second capacitor-group power supply strip is coupled to the aforementioned L second conductor(s) 336 of the second capacitor group. Since the way to couple a power supply strip with one or more conductors is common in this technical field, its detail is omitted here.

Figure 1A:
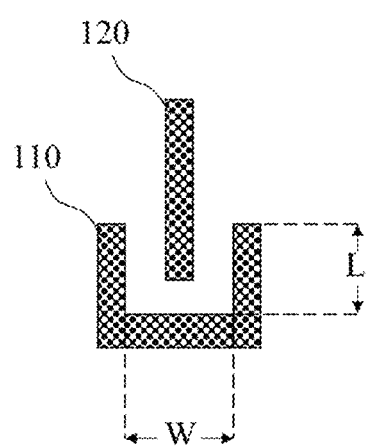
FIG. 1a shows the design of a capacitor unit according to the prior art.
Figure 1B:
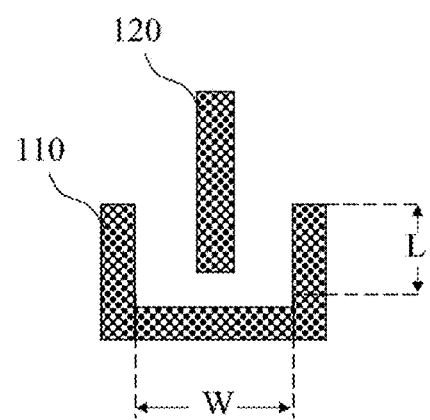
FIG. 1b shows how the design of the capacitor unit in FIG. 1a is modified to conform to the specification of an advanced process.
Figure 2:
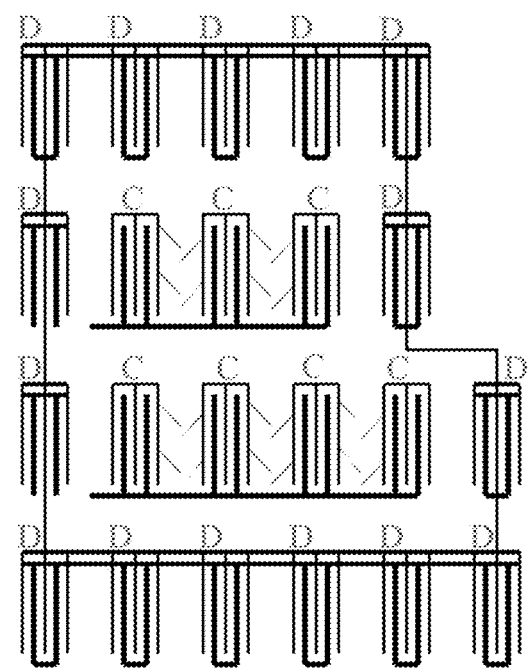
FIG. 2 shows a general semiconductor capacitor array layout.

In regard to the $[(M-1)\times(N-1)]$ well-shaped structures in FIG. 3a, the longitudinal first conductive strips 310 and the second conductors 332, 334, and 336 located in the first IC layer can lie in the same direction to conform to the specification of a semiconductor manufacturing process, but the implementation of the present invention is not limited thereto. For example, providing the conductive strips and the conductors of all the capacitor units in the first IC layer in FIG. 3a are lying in the same direction and not in the form of the U-shaped structure as shown in FIG. 1b, these capacitor units can be manufactured without wasting circuit area and conform to the specification of an advanced process (e.g., Fin Field-Effect Transistor (FinFET) process).

Figure 4:
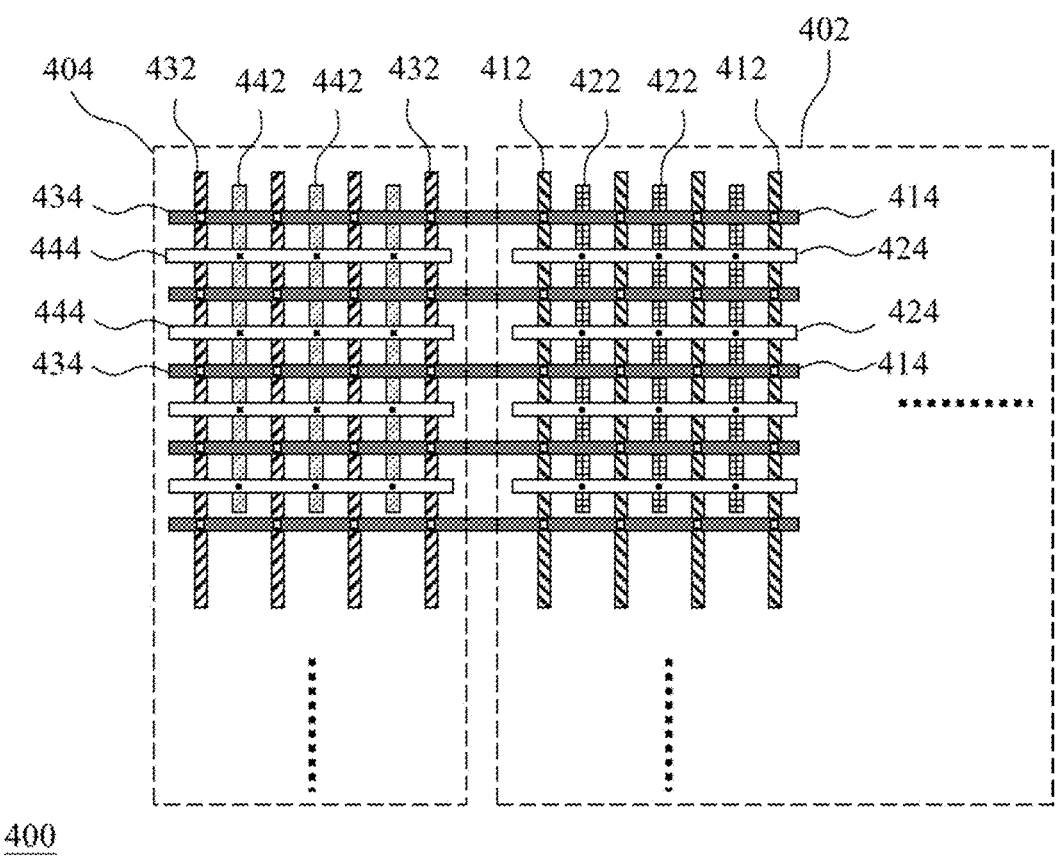
FIG. 4 shows another embodiment of the semiconductor capacitor array layout of the present disclosure.

FIG. 4 shows another embodiment of the semiconductor capacitor array layout of the present disclosure. The semiconductor capacitor array layout 400 of FIG. 4 includes a primary capacitor structure 402 and an outer capacitor structure 404. The primary capacitor structure 402 includes a first conductive structure and a second conductive structure. The outer capacitor structure 404 includes a third conductive structure and a fourth conductive structure. The first conductive structure and the third conductive structure are electrically coupled together and used for the transmission of a first voltage. The second conductive structure is used for the transmission of a second voltage. The fourth conductive structure is used for the transmission of a predetermined voltage (e.g., a voltage such as an operating voltage $V_{DD}$ or a ground voltage GND that can be used easily) or not used for any voltage transmission. Any two of the first voltage, the second voltage, and the predetermined voltage are different. On the basis of the above, the first conductive structure and the second conductive structure of the primary capacitor structure 402 jointly compose an effective capacitor unit. The third conductive structure and the fourth conductive structure of the outer capacitor structure 404 jointly compose a subsidiary capacitor unit. The second conductive structure of the primary capacitor structure 402 and the third conductive structure of the outer capacitor structure 404 jointly generate parasitic capacitance.

In regard to the embodiment of FIG. 4, the first conductive structure includes longitudinal first conductive strips 412 (i.e., the longitudinal strips marked with backslashes of the primary capacitor structure 402 in FIG. 4) and lateral first conductive strips 414 (i.e., the gray lateral strips of the primary capacitor structure 402 in FIG. 4). The longitudinal first conductive strips 412 are located in a first IC layer (e.g., a metal layer), and the lateral first conductive strips 414 are located in a second IC layer (e.g., another metal layer). The lateral first conductive strips 414 are coupled to the longitudinal first conductive strips 412 through first vias (e.g., the small white blocks of the primary capacitor structure 402 coupling the gray lateral strips with the longitudinal strips marked with backslashes in FIG. 4), and used for the transmission of a first voltage.

In regard to the embodiment of FIG. 4, the second conductive structure includes longitudinal second conductive strips 422 (i.e., the longitudinal strips marked with grids of the primary capacitor structure 402 in FIG. 4) and lateral second conductive strips 424 (i.e., the white lateral strips of the primary capacitor structure 402 in FIG. 4). The longitudinal second conductive strips 422 are located in the first IC layer, and the lateral second conductive strips 424 are located in the second IC layer. The lateral second conductive strips 424 are coupled to the longitudinal second conductive strips 422 through second vias (i.e., the small black blocks of the primary capacitor structure 402 coupling the white lateral strips with the longitudinal strips marked with grids in FIG. 4), and used for the transmission of a second voltage that is different from the aforementioned first voltage. The longitudinal first conductive strips 412 and the longitudinal second conductive strips 422 are alternatively disposed in the first IC layer, and the lateral first conductive strips 414 and the lateral second conductive strips 424 are alternatively disposed in the second IC layer.

In regard to the embodiment of FIG. 4, the third conductive structure includes longitudinal third conductive strips 432 (i.e., the longitudinal strips marked with slashes of the outer capacitor structure 404 in FIG. 4) and lateral third conductive strips 434 (i.e., the gray lateral strips of the outer capacitor structure 404 in FIG. 4). The longitudinal third conductive strips 432 are located in the first IC layer, and the lateral third conductive strips 434 are located in the second IC layer and coupled to the longitudinal third conductive strips 432 through third vias (e.g., the small white blocks of the outer capacitor structure 404 coupling the gray lateral strips with the longitudinal strips marked with slashes in FIG. 4). Each lateral first conductive strip 414 and the lateral first conductive strip 434 coupled thereto are a first part and a second part of one lateral conductive strip respectively.

In regard to the embodiment of FIG. 4, the fourth conductive structure includes longitudinal fourth conductive strips 442 (i.e., the longitudinal strips marked with dots of the outer capacitor structure 404 in FIG. 4) and lateral fourth conductive strips 444 (i.e. the white lateral strips of the outer capacitor structure 404 in FIG. 4). The longitudinal fourth conductive strips 442 are located in the first IC layer, and the lateral fourth conductive strips 444 are located in the second IC layer. The lateral fourth conductive strips 444 can be coupled to the longitudinal fourth conductive strips 442 through fourth vias (i.e., the small black blocks of the outer capacitor structure 404 coupling the white lateral strips with the longitudinal strips marked with dots in FIG. 4) according to the demand for implementation, but this is optional. The longitudinal third conductive strips 432 and the longitudinal fourth conductive strips 442 are alternatively disposed in the first IC layer, and the lateral third conductive strips 434 and the lateral fourth conductive strips 444 are alternatively disposed in the second IC layer. It should be noted that the number of the longitudinal first conductive strips 412 can be the same as or different from the number of the longitudinal third conductive strips 432, and the number of the longitudinal second conductive strips 422 can be the same as or different from the number of the longitudinal fourth conductive strips 442.

It should be noted that the primary capacitor structure 402 can include more effective capacitor units and the outer capacitor structure 404 can include more subsidiary capacitor units as illustrated with the ellipses of FIG. 4 which are used for the prevention of a complicated drawing. Since people having ordinary skill in the art can refer to the present disclosure to appreciate the implementation of other effective capacitor units and subsidiary capacitor units, repeated and redundant description is omitted here. In FIG. 4, the longitudinal and lateral conductive strips of all the effective capacitor units for the transmission of the first voltage are electrically coupled together; the longitudinal and lateral conductive strips of all the effective capacitor units for the transmission of the second voltage are electrically coupled together provided these conductive strips pertain to the same capacitor group. Those capacitor units as a whole pertaining to the same capacitor group can be treated as a larger capacitor.

It should be noted that the size (i.e., the length, width, and thickness) of the strip-shaped conductor (e.g., conductive strip or power supply strip) mentioned in the present specification and the variation in this size are not limited to specific specifications and can be determined according to the demand for implementation. Therefore, the strip-shaped conductor may be in the shape of an unconventional/arbitrary strip. It should also be noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the semiconductor capacitor array layout of the present disclosure can mitigate the problem of the prior art about the waste of circuit area, prevent the problem caused by the U-shaped structure of the prior art applied in an advanced process, and reduce the difference in capacitance between an outer capacitor unit and an inner capacitor unit.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A semiconductor capacitor array layout capable of generating parasitic capacitance toward an edge of the semiconductor capacitor array layout, the semiconductor capacitor array layout comprising:
   a first conductive structure including:
      M longitudinal first conductive strips located in a first integrated circuit (IC) layer, wherein the M is an integer greater than two; and
      N lateral first conductive strips located in a second IC layer, wherein the N is an integer greater than one, the N lateral first conductive strips are coupled to the M longitudinal first conductive strips through first vias, the N lateral first conductive strips and the M longitudinal first conductive strips jointly form $[(M-1)\times(N-1)]$ well-shaped structures, the $[(M-1)\times(N-1)]$ well-shaped structures include $(N-1)$ outer well(s) and $\{[(M-2)\times(N-1)]\}$ inner well(s), and the $(N-1)$ outer well(s) and the $\{[(M-2)\times(N-1)]\}$ inner well(s) are electrically coupled together; and a second conductive structure including:
$[(M-1)\times(N-1)]$ second conductors located in the first IC layer and respectively positioned in the $[(M-1)\times(N-1)]$ well-shaped structures, wherein the $[(M-1)\times(N-1)]$ second conductors include $(N-1)$ outer second conductor(s) and $\{[(M-2)\times(N-1)]\}$ inner second conductor(s), the $(N-1)$ outer second conductor(s) is/are positioned in the $(N-1)$ outer well(s), the $\{[(M-2)\times(N-1)]\}$ inner second conductor(s) are positioned in the $\{[(M-2)\times(N-1)]\}$ inner well(s), and the $(N-1)$ outer second conductor(s) and the $\{[(M-2)\times(N-1)]\}$ inner second conductor(s) are not electrically coupled together, wherein the M longitudinal first conductive strips and the N lateral first conductive strips are used for transmission of a first voltage, the $\{[(M-2)\times(N-1)]\}$ inner second conductor(s) is/are used for transmission of a second voltage, the $(N-1)$ outer second conductor(s) is/are used for transmission of a predetermined voltage or not used for any voltage transmission, the first voltage is different from each of the second voltage and the predetermined voltage, the predetermined voltage is different from the second voltage, $(N-1)$ inner second conductor(s) of the $\{[(M-2)\times(N-1)]\}$ inner second conductor(s) is/are next to the $(N-1)$ outer well(s), and the $(N-1)$ inner second conductor(s) and the $(N-1)$ outer well(s) jointly generate the parasitic capacitance.

2. The semiconductor capacitor array layout of claim 1, wherein each of the $[(M-1)\times(N-1)]$ second conductors includes at least one conductive strip.

3. The semiconductor capacitor array layout of claim 1, wherein the M is an integer greater than three, the $\{[(M-2)\times(N-1)]\}$ inner second conductors include K second conductor(s) pertaining to a first capacitor group among P capacitor groups, the $\{[(M-2)\times(N-1)]\}$ inner second conductors include L second conductor(s) pertaining to a second capacitor group among the P capacitor groups, the P is an integer greater than one, the K is a positive integer not greater than $\{[(M-2)\times(N-1)]-1\}$, and the L is a positive integer not greater than $\{[(M-2)\times(N-1)]-K\}$.

4. The semiconductor capacitor array layout of claim 1, wherein the N is greater than two, and the $(N-1)$ outer second conductors are electrically coupled together.

5. The semiconductor capacitor array layout of claim 1, wherein a shape of each of the $(N-1)$ outer second conductor(s) is substantially identical to a shape of each of the $\{[(M-2)\times(N-1)]\}$ inner second conductor(s).

6. A semiconductor capacitor array layout capable of generating parasitic capacitance toward an edge of the semiconductor capacitor array layout, the semiconductor capacitor array layout comprising:

a first conductive structure including:
M longitudinal first conductive strips located in a first integrated circuit (IC) layer, wherein the M is an integer greater than three; and
N lateral first conductive strips located in a second IC layer, wherein the N is an integer greater than three, the N lateral first conductive strips are coupled to the M longitudinal first conductive strips through first vias, the N lateral first conductive strips and the M longitudinal first conductive strips jointly form $[(M-1)\times(N-1)]$ well-shaped structures, the $[(M-1)\times(N-1)]$ well-shaped structures include $[2\times(M+N-4)]$ outer wells and $\{[(M-3)\times(N-3)]\}$ inner well(s), and the $[2\times(M+N-4)]$ outer wells and the $\{[(M-3)\times(N-3)]\}$ inner well(s) are electrically coupled together; and a second conductive structure including:
$[(M-1)\times(N-1)]$ second conductors located in the first IC layer and respectively positioned in the $[(M-1)\times(N-1)]$ well-shaped structures, wherein the $[(M-1)\times(N-1)]$ second conductors include $[2\times(M+N-4)]$ outer second conductors and $\{[(M-3)\times(N-3)]\}$ inner second conductor(s), the $[2\times(M+N-4)]$ outer second conductors is/are positioned in the $[2\times(M+N-4)]$ outer wells, the $\{[(M-3)\times(N-3)]\}$ inner second conductor(s) are positioned in the $\{[(M-3)\times(N-3)]\}$ inner well(s), and the $[2\times(M+N-4)]$ outer second conductors and the $\{[(M-3)\times(N-3)]\}$ inner second conductor(s) are not electrically coupled together, wherein the M longitudinal first conductive strips and the N lateral first conductive strips are used for transmission of a first voltage, the $\{[(M-3)\times(N-3)]\}$ inner second conductor(s) is/are used for transmission of a second voltage, the $[2\times(M+N-4)]$ outer second conductors is/are used for transmission of a predetermined voltage or not used for any voltage transmission, the first voltage is different from each of the second voltage and the predetermined voltage, the predetermined voltage is different from the second voltage, X inner second conductor(s) of the $\{[(M-3)\times(N-3)]\}$ inner second conductor(s) is/are next to the $[2\times(M+N-4)]$ outer wells, the X inner second conductor(s) and the $[2\times(M+N-4)]$ outer wells jointly generate the parasitic capacitance, the X is equal to $\{[(M-3)\times(N-3)]\}$ when at least one of the M and the N is equal to four, and the X is equal to $\{[(M-3)\times(N-3)]-[(M-5)\times(N-5)]\}$ when both the M and the N are greater than four.

7. The semiconductor capacitor array layout of claim 6, wherein each of the $[(M-1)\times(N-1)]$ second conductors includes at least one conductive strip.

8. The semiconductor capacitor array layout of claim 6, wherein at least one of the M and the N is an integer greater than four, the $\{[(M-3)\times(N-3)]\}$ inner second conductors include K second conductor(s) pertaining to a first capacitor group among P capacitor groups, the $\{[(M-3)\times(N-3)]\}$ inner second conductors include L second conductor(s) pertaining to a second capacitor group among the P capacitor groups, the P is an integer greater than one, the K is a positive integer not greater than $\{[(M-3)\times(N-3)]-1\}$, and the L is a positive integer not greater than $\{[(M-3)\times(N-3)]-K\}$.

9. The semiconductor capacitor array layout of claim 6, wherein the $[2\times(M+N-4)]$ outer second conductors are electrically coupled together.

10. The semiconductor capacitor array layout of claim 6, wherein a shape of each of the $[2\times(M+N-4)]$ outer second conductors is substantially identical to a shape of each of the $\{[(M-3)\times(N-3)]\}$ inner second conductor(s).

* * * * *